United States Patent
Ogihara

(10) Patent No.: US 10,459,344 B2
(45) Date of Patent: Oct. 29, 2019

(54) EXPOSURE METHOD AND EXPOSURE DEVICE

(71) Applicant: Mitutoyo Corporation, Kawasaki-shi (JP)

(72) Inventor: Motonori Ogihara, Kawasaki (JP)

(73) Assignee: MITUTOYO CORPORATION, Kawasaki-shi (JP)

( * ) Notice: Subject to any disclaimer, the term of this patent is extended or adjusted under 35 U.S.C. 154(b) by 0 days.

(21) Appl. No.: 16/138,006

(22) Filed: Sep. 21, 2018

(65) Prior Publication Data
US 2019/0094701 A1 Mar. 28, 2019

(30) Foreign Application Priority Data
Sep. 22, 2017 (JP) .................. 2017-182352

(51) Int. Cl.
*G03F 7/20* (2006.01)

(52) U.S. Cl.
CPC ............ *G03F 7/7055* (2013.01); *G03F 7/709* (2013.01); *G03F 7/7015* (2013.01); *G03F 7/70775* (2013.01)

(58) Field of Classification Search
CPC ............. G03F 7/70066; G03F 7/70558; G03F 7/7055; G03F 7/70358
USPC ......................................... 355/52, 53, 55, 67
See application file for complete search history.

(56) References Cited

U.S. PATENT DOCUMENTS

| 5,883,701 A * | 3/1999 | Hasegawa ........... G03F 7/70358 355/53 |
| 6,501,533 B1 * | 12/2002 | Murata ............... G03F 7/70066 355/53 |
| 2006/0178763 A1 | 8/2006 | Kobayashi et al. |

FOREIGN PATENT DOCUMENTS

JP  2006-216852 A  8/2006

OTHER PUBLICATIONS

Susumu Makinouchi, et al., "New Stage System for Step-and Repeat Scanning Stepper" Journal of the Japan Society of Precision Engineering, vol. 61, No. 12, 1995, pp. 1676-1680 (with Partial English translation).

* cited by examiner

*Primary Examiner* — Hung Nguyen
(74) *Attorney, Agent, or Firm* — Oblon, McClelland, Maier & Neustadt, L.L.P.

(57) ABSTRACT

An exposure method for projecting a pattern on an exposure mask onto a work by an exposure control of an exposure light including calculating an exposure position on the work from a relative positional relationship of the exposure mask and the work, setting a range acceptable for projecting the pattern even when the exposure position is off a target exposure position on the work as an exposure position range, and (3) executing an exposure control that irradiates the exposure light to the exposure mask when the exposure position is in the exposure position range, and that stops the exposure light when the exposure position is out of the exposure position range.

15 Claims, 11 Drawing Sheets

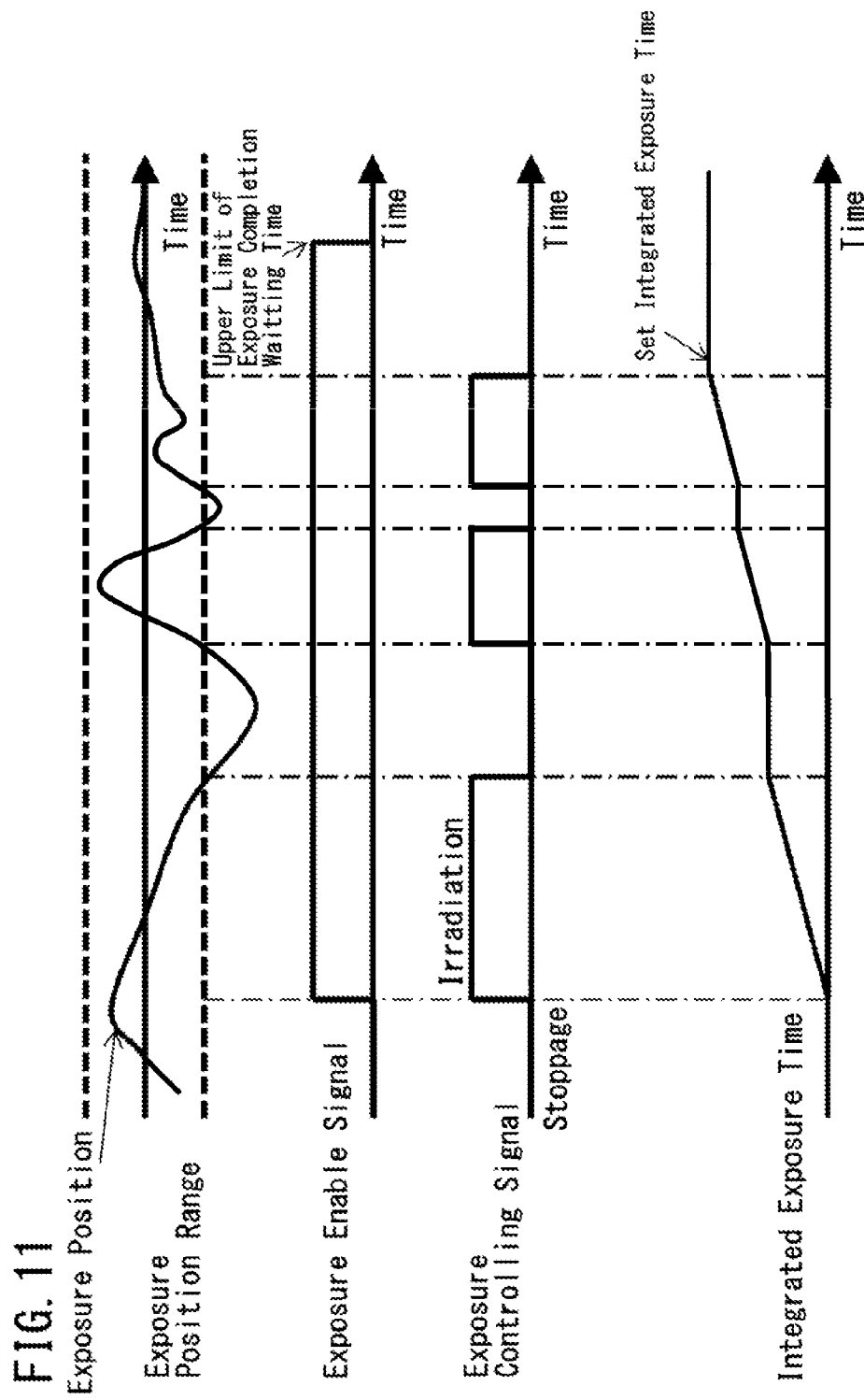

EXPOSURE METHOD AND EXPOSURE DEVICE

RELATED APPLICATIONS

This application claims the priority of Japanese Patent Application No. 2017-182352 filed on Sep. 22, 2017, which is incorporated herein by reference.

FIELD OF THE INVENTION

The present invention relates to a manufacturing technology of semi-conductors, scales or the like that uses photolithography technique.

BACKGROUND OF THE INVENTION

Precision of an exposure position on a work of an exposure device is usually determined by positioning precision of the exposure device. Hence, exposure devices are configured to have high positioning precision by using non-contact Hydrostatic guides that can reduce friction force, or using linear motors that can enhance rigidity of feed mechanisms.

Photolithography technique is yearly improving in accordance with miniaturization of a circuit pattern. However, improvement in positioning precision of exposure devices is becoming more difficult year by year.

Non-Patent Literature 1 introduces an evaluation method for positioning precision by probability distribution of a position of a stage during exposure, and states micro vibration generated during exposure as a first factor of deteriorating positioning precision of an exposure position. Further, position precision tends to be deteriorated as an exposure time becomes shorter. Therefore, a residual vibration after stepping movement is considered to be a second factor of deteriorating positioning precision of the exposure position.

In Patent Literature 1, a method to achieve exposure at a precise position with respect to a work even if the exposure device is during residual vibration is proposed in regard to a controlling method of the exposure device. The exposure device of Patent Literature 1 comprises an exposure unit as a moving body, a position sensor that detects a position of the exposure unit, and a controlling circuit that sets an exposure start time of the exposure unit based on a signal from the position sensor. The controlling circuit predicts timing that the position of the exposure unit during residual vibration intersects a target position, and sets the exposure start time such that exposure starts by going back from the predicted timing for a half of the required exposure time. Thus, the exposure time is set by centering the target position of exposure. In other words, the exposure unit passes through the target position at the timing when half of the exposure time has passed. Accordingly, it is described that exposure to the target position on the work becomes possible during residual vibration.

CITATION LIST

Patent Literature

PATENT LITERATURE 1: Japanese Unexamined Patent Publication No. JP2006-216852

Non-Patent Literature

NON-PATENT LITERATURE 1: New Stage System for Step-and Repeat Scanning Stepper. Journal of the Japan Society of Precision Engineering. Vol. 61 (1995) No. 12, p. 1676-1680.

SUMMARY OF THE INVENTION

In the controlling method described in Patent Literature 1, the exposure unit that is residually-vibrating passes the target position on the work at the timing when half of the exposure time has passed, so that the target position can be exposed during residual vibration. However, residual vibration of the exposure unit changes in accordance with a state of the device (individual difference, temperature/change over time, or the like), and thus an exposure range becomes large or small in accordance with change of amplitude or frequency of the residual vibration.

The present embodiments improve precision of the exposure position of the exposure device such that the exposure position falls within the predetermined range, whatever the influence of factors including the residual vibration at positioning of the exposure device. Hence, an aim of the present invention is to provide an exposure method and an exposure device capable of making an exposure position to fall within a predetermined range at a level higher than positioning precision of the exposure device even if the exposure device is affected by factors including residual vibration at positioning of the exposure device.

(1) An exposure controlling method based on positional relationship between an exposure mask and a work.

To solve the aforementioned problems, an exposure method according to the present invention is to project a pattern of an exposure mask onto a work by an exposure light and comprises:

an exposure position calculating step for calculating an exposure position on the work from relative positional relationship of the exposure mask and the work;

an exposure position range setting step for setting a predetermined range that includes a target exposure position on the work and is acceptable for projecting the pattern even if the exposure position is out of the target exposure position as an exposure position range; and an exposure controlling step for executing an exposure control by an exposure controlling signal that executes irradiation of the exposure light to the exposure mask when the exposure position calculated at the exposure position calculating step is in the exposure position range set at the exposure position range setting step, and stops irradiation of the exposure light when the exposure position is out of the exposure position range, and the exposure light is irradiated for a predetermined exposure time by the exposure control.

The position information of the exposure mask and the work may be expressed by a one-dimensional coordinate, a two-dimensional coordinate, or a three-dimensional coordinate, and information of the exposure position range is set by a coordinate in a dimension same as or lower than the exposure mask and the work.

In the exposure position calculating step, the exposure position is calculated for every predetermined calculating cycle ($\Delta t$), and an estimated exposure position after a set time based on a time-series information of the exposure position to the present time is calculated, and in the exposure controlling step, the exposure control is executed based on at least one of the exposure position or the estimated exposure position.

In the exposure position calculating step, velocity based on the time-series information of the exposure position to the present time is used, or both of velocity and acceleration are used to calculate the estimated exposure position after the set time.

In the exposure position calculating step, the exposure position is calculated for every predetermined calculating cycle ($\Delta t$); and after estimated positions of the exposure mask and the work after the set time are respectively calculated based on the time-series information of each position of the exposure mask and the work to the present time, the estimated exposure position after the set time is calculated; and in the exposure controlling step, the exposure control is executed based on at least one of the exposure position or the estimated exposure position.

In the exposure position calculating step, velocities of the exposure mask and the work based on the time-series information of each position of the exposure mask and the work to the present time are used, or both of velocities and accelerations of the exposure mask and the work are used to calculate each estimated position of the exposure mask and the work after the set time.

(2) An exposure controlling method aimed for an effect combined with position control.

The exposure method according to the present invention further comprises a position controlling step of position-controlling each position of the exposure mask and the work for every predetermined sampling time, wherein at least the position controlling step is executed during execution of the exposure position calculating step, and in the exposure calculating step, the exposure position and the estimated exposure position are calculated by a state observing device (observer) which receives each position controlling signal of the exposure mask and the work used in the position controlling step and the time-series information of the positions of the exposure mask and the work as input values.

(3) An exposure controlling method based on relationship of a position and a posture between the exposure mask and the work.

In the exposure method according to the present invention:

the exposure position calculating step further comprises calculating an exposure direction on the work from a relative relationship of the postures of the exposure mask and the work;

the exposure position range setting step further comprises setting of a predetermined range that includes a target exposure direction on the work and is acceptable for projecting the pattern even if the exposure direction is out of the target exposure direction as an exposure direction range; and in the exposure controlling step, irradiation of the exposure light is executed when the exposure position is in the exposure position range and the exposure direction is in the exposure direction range.

Information of the position and the posture of the exposure mask and information of the position and the posture of the work are respectively expressed by information of six degrees of freedom at maximum, and information of the exposure position range and the exposure direction range are respectively set by information of the same degrees of freedom as the exposure mask and the work respectively, or lower degrees of freedom than the exposure mask and the work respectively.

In the exposure position calculating step, the exposure position and the exposure direction are calculated for every predetermined calculating cycle ($\Delta t$), and an estimated exposure position and an estimated exposure direction after a set time are further calculated based on a time-series information of the exposure position and the exposure direction to the present time, and, in the exposure controlling step, the exposure control is executed based on at least one of the exposure position, the exposure direction, the estimated exposure position and the estimated exposure direction.

Further, in the exposure position calculating step, a changing velocity of exposure direction based on a time-series information of the exposure direction to the present time is used, or both of a changing velocity of exposure direction and a changing acceleration of exposure direction are used to calculate the estimated exposure direction after the set time.

Further, in the exposure position calculating step, the exposure direction is calculated for every predetermined calculating cycle ($\Delta t$), and after estimated postures of the exposure mask and the work after a set time are respectively calculated based on a time-series information of postures of the exposure mask and the work to the present time, the estimated exposure direction after the set-time is calculated, and, in the exposure controlling step, the exposure control is executed based on at least one of the exposure position, the exposure direction, the estimated exposure position and the estimated exposure direction.

Further, in the exposure position calculating step, posture changing velocities of the exposure mask and the work based on a time-series information of each posture of the exposure mask and the work to the present time are used, or both of the posture changing velocities and a posture changing accelerations of the exposure mask and the work are used to calculate each estimated posture of the exposure mask and the work after the set time.

(4) An exposure controlling method aimed for an effect combined with position control and posture control.

In the exposure method according to the present invention and in the position controlling step, postures of the exposure mask and the work are posture-controlled for every sampling time; and, in the exposure position calculating step, the exposure direction and the estimated exposure direction are calculated by the state observing device (observer) which receives each posture controlling signal of the exposure mask and the work used in the position controlling step and a time-series information of postures of the exposure mask and the work as input values.

(5) An exposure controlling method of which a processing time from detection of positions of the exposure mask and the work to a stoppage of the exposure light is taken into consideration.

In the exposure method according to the present invention time necessary from detection of the positions of the exposure mask and the work to a stoppage of the exposure light is regarded as a processing time (Td), and in the exposure position calculating step, time of which the processing time (Td) is added to the calculating cycle ($\Delta t$) is set as the set time, and an estimated exposure position or an estimated exposure position and an estimated exposure direction after the set time is/are calculated.

(6) An exposure controlling method including an exposure abnormality determination.

The exposure method according to the present invention further comprises:

an exposure time integrating step of integrating an irradiation time of the exposure light based on the exposure controlling signal to calculate an integrated exposure time, and an exposure abnormality determining step of determining an exposure abnormality when a time after integrating start exceeds an upper limit of an exposure completion waiting time before the integrated exposure time reaches the predetermined exposure time.

(7) An exposure device.

The exposure device according to the present invention comprises: an exposure light source; an exposure mask disposed at a position where an exposure light from the exposure light source is received; a projecting lens that projects a pattern of the exposure mask onto a work; a detector that detects a relative positional relationship of the exposure mask and the work; a moving base that relatively moves the exposure mask and the work to change an exposure position on the work; and a controlling unit of controlling at least irradiation/stoppage of the exposure light source, wherein the controlling unit comprises:

an exposure position calculating portion for calculating an exposure position on the work from a relative positional relationship of the exposure mask and the work;

an exposure position range setting portion for setting a predetermined range as an exposure position range that includes a target exposure positon on the work and is acceptable for projecting the pattern even if the exposure position is out of the target exposure position; and an exposure controlling portion for executing an exposure control by an exposure controlling signal that executes irradiation of the exposure light to the exposure mask when the exposure position calculated by the exposure position calculating portion is in the exposure position range set by the exposure position range setting portion, and stops irradiation of the exposure light when the exposure target position is out of the exposure position range, and the exposure light is irradiated for a predetermined exposure time by the exposure control.

The controlling unit further comprises a position controlling portion for position-controlling each position of the exposure mask and the work for every predetermined sampling time, wherein at least the position controlling portion is executed while the exposure position calculating portion is executed, and the exposure position calculating portion comprises a state observing device (observer) that receives each position controlling signal of the exposure mask and the work used in the position controlling portion and a time-series information of the positons of the exposure mask and the work as input values to calculate the exposure position and the estimated exposure position.

According to the procedures of the present invention, the exposure position or the estimated exposure position of the exposure machine is calculated, and irradiation/stoppage of the exposure light source is controlled such that the exposure light is irradiated when a calculated value of the exposure position or the estimated exposure position is within the predetermined range on the work. Accordingly, even if the exposure device is affected by factors including residual vibration or the like at positioning of the exposure device, the exposure position can be set within the predetermined range on the work at a level higher than positioning precision of the exposure device.

BRIEF DESCRIPTION OF THE DRAWINGS

FIG. 11 is a diagram for explaining an exposure method according to a fourth embodiment of the present invention that shows relationship of an upper limit of an exposure completion waiting time and an integrated exposure time.

DETAILED DESCRIPTION

Hereinbelow, embodiments of the present invention are described with reference to drawings.

First Embodiment

Figure 1:
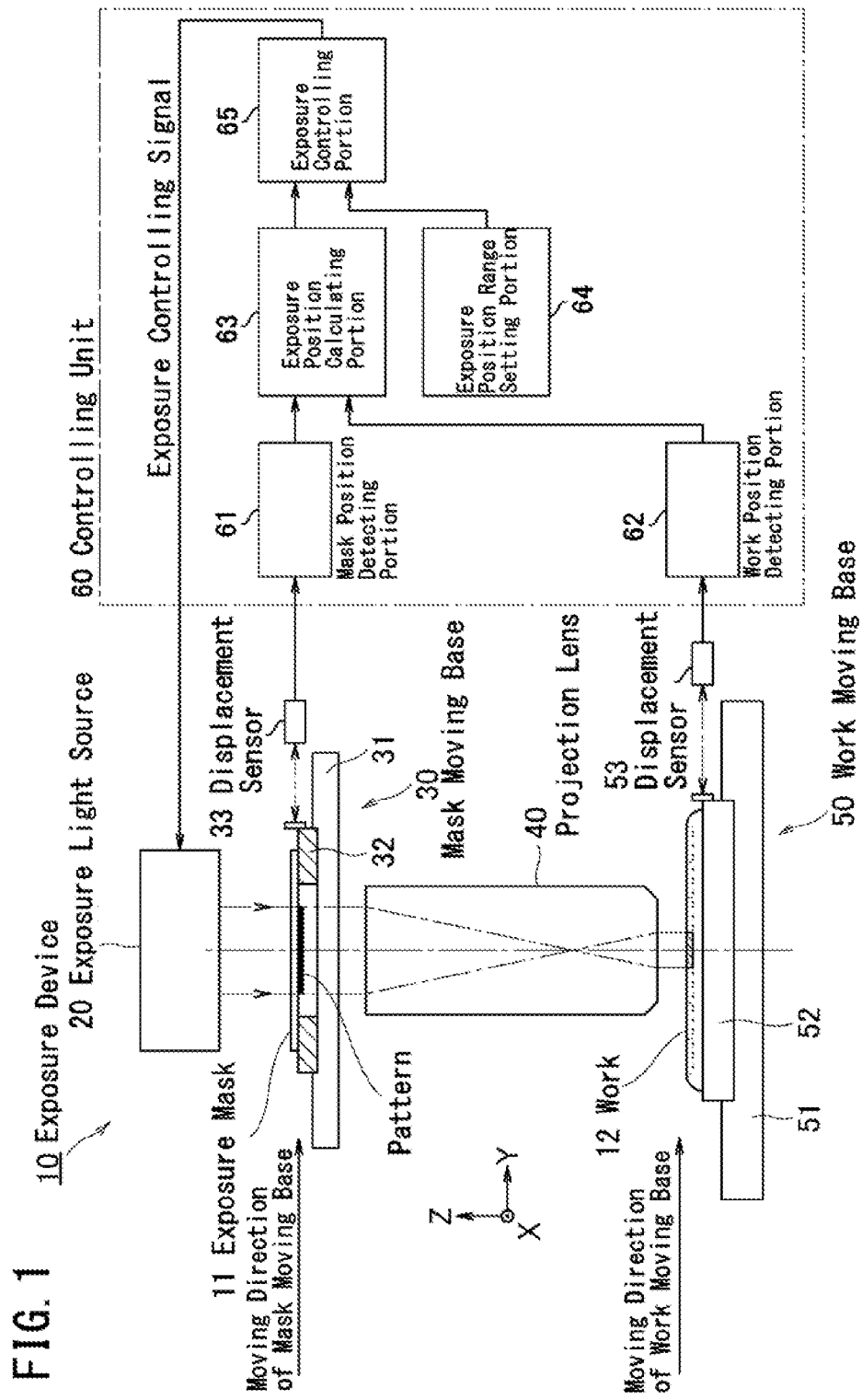
FIG. 1 is a block diagram showing an exposure device according to a first embodiment of the present invention.

FIG. 1 is a block diagram of an exposure device according to the present embodiment. This exposure device 10 performs a stepping moving operation, and, at the same time, determines a reduced image of a pattern at each target exposure position on a work to execute exposure for each position while a work moving base is positioned. In this description, an X-Y-Z orthogonal coordinate system having an optical axis of an exposure light that is described below as a Z-axis is used for explanation.

The exposure device 10 comprises an exposure light source 20 aligned along an optical axis of an exposure light, a mask moving base 30, a projecting lens 40, and a work moving base 50, and is connected to a controlling unit (controlling circuitry) 60 by a signal line.

The exposure light source 20 irradiates a laser light or the like as the exposure light.

The mask moving base 30 is constituted of a fixing guide 31 and a movable table 32, and moves an exposure mask 11 disposed on the movable table 32 in Y-direction that is orthogonal to the optical axis of the exposure light. Accordingly, the mask moving base 30 can change position of the exposure mask 11 that receives the exposure light from the exposure light source 20. Holes, notches or the like that the exposure light passes through are formed at the center of the movable table 32. In the present embodiment, a linear motor is adopted as a driving means of the movable table 32. Further, an air guide is provided on a guide face between the fixing guide 31 as a guiding means. However, other machine elements may be applied as these driving means and guiding means.

Further, a displacement sensor 33 that detects the position of the movable table 31 is provided to the mask moving base 30, and the controlling unit 60 receives this detected signal. A laser interferometer or the like may be adapted as the displacement sensor 33.

On the exposure mask 11, a desired pattern such as a semi-conductor circuit pattern, a liquid crystal element pattern, a scale pattern used for a linear encoder, or the like is formed thereon.

The projecting lens 40 projects a reduced image of the pattern of the exposure mask 11 on the work 12. The exposure light from the exposure light source 20 is irradiated to the pattern of the exposure mask 11, and is focused at the projecting lens 40 to form a latent image of the pattern on a work surface that has photoresists applied thereon. When the present invention is applied to an exposure device that projects a pattern of actual size, the projecting lens 40 is omitted from the exposure device. Further, the exposure light from the exposure light source 20 is not limited to a parallel light flux. For example, an exposure light that converges toward a certain point may be irradiated to the exposure mask 11, and the aforementioned projecting lens 40 may be omitted.

The work moving base 50 is constituted of the fixing guide 51 and the movable table 52, and intermittently moves the work 12 disposed on the movable table 52 to Y-direction that is orthogonal to the optical axis of the exposure light. Accordingly, projecting positions of the pattern are aligned in order with respect to several target exposure positions set on the work 12. That is, the work moving base 50 functions as a stepping moving base for moving the work 12, an exposure target. In the present embodiment, a liner motor is adopted as a driving means for the movable table 52 and an air guide is provided as the guiding means on a guide surface between the fixing guide 51, but other machine element may be applied as the driving means and the guiding means.

Further, a displacement sensor 53 that detects a position of the movable table 52 is provided to the work moving base 50, and the controlling unit 60 receives this detected signal. A laser interferometer or the like may be applied as the displacement sensor.

Hereinbelow, the controlling unit 60 that performs the exposure control that is characteristic in the present invention is described in detail.

The controlling unit 60 outputs an exposure controlling signal for switching on/off of irradiation of the exposure light source 20 according to the input of the detection signals from each displacement sensor 33, 53. Accordingly, the controlling unit 60 has a mask position detecting portion 61, a work position detecting portion 62, an exposure position calculating portion 63, an exposure position range setting portion 64 and an exposure controlling portion 65.

The mask position detecting portion 61 and the work position detecting portion 62 give the detected signals from each displacement sensor 33, 53 to the exposure position calculating portion 63 as information of each position of the exposure mask 11 and the work 12. Accordingly, the exposure position calculating portion 63 can obtain information of relative positional relationship of the exposure mask 11 and the work 12.

The exposure position calculating portion 63 specifically calculates the exposure position on the work from relative positional relationship of the exposure mask 11 and the work 12 to give information of the exposure position to the exposure controlling portion 65.

Figure 2:
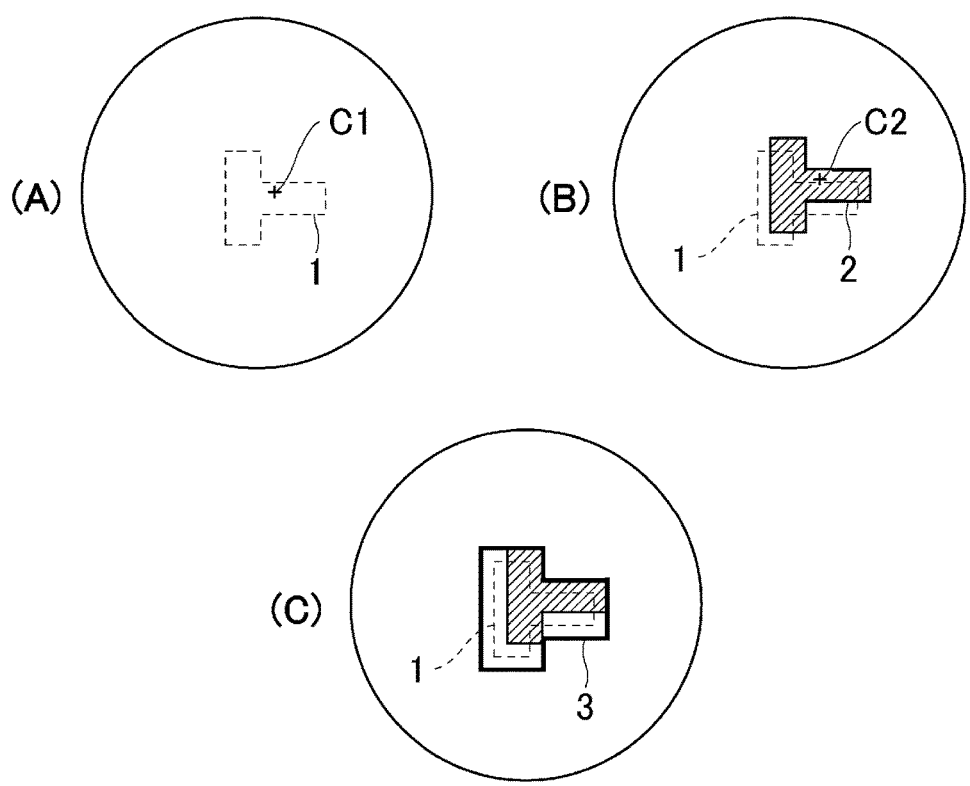
FIG. 2 is a schematic diagram showing an example of relationship of a target exposure position, an exposure position and an exposure position range on a work.

The exposure position range setting portion 64 has a function of setting a predetermined range that includes the target exposure positon on the work and is acceptable for projecting the pattern even if the exposure position is out of the target exposure position as an exposure position range. An example of a setting method of the exposure position range is described with reference to FIG. 2. Enlarged views in FIG. 2(A) to 2(C) show the same microscopic region on the work surface. The microscopic region of FIG. 2(A) shows a target exposure position 1 of a certain pattern. A point C1 is the center of the target exposure position. In FIG. 2(B), the position of the pattern that is actually projected aiming at the exposure target position 1 shown by a dashed line is shown by a solid line as an exposure position 2. A point C2 is the center of the exposure position 2.

It is technically difficult and not realistic to completely match the exposure position 2 with the target exposure position 1. Thus, a range of the exposure position 2 that would be determined as its effect on quality of pattern formation is small even if the exposure position 2 is slightly off the target exposure position 1 like FIG. 2(B) is set as the exposure position range in advance. An exposure position range 3 is shown as a range surrounded by a thick line in FIG. 2(C). FIG. 2 is an example that has set the exposure position range 3 in X-Y plane.

Information of the exposure position range set by the exposure position range setting portion 64 is given to the exposure controlling portion 65.

The exposure controlling portion 65 in FIG. 1 uses information of the exposure position from the exposure position calculating portion 63 and information of the exposure position range from the exposure position range setting portion 64 to output the exposure controlling signal to the exposure light source 20. When the exposure position is in the exposure position range, the exposure controlling signal becomes a command signal to execute irradiation of the exposure light (irradiation signal). When the exposure position is out of the exposure position range, the exposure controlling signal becomes a command signal to stop irradiation of the exposure light (stop signal). When the exposure position enters the exposure position range again, the exposure controlling signal becomes a command signal to restart irradiation of the exposure light (irradiation signal).

Each constituting element of the controlling unit 60 can be constituted by an analog circuit that uses an operational amplifier, a comparator, or the like. It can be constituted by a digital arithmetic device such as CPU, DSP (Digital Signal Processing) or the like. In a digital constitution, a program that calculates the exposure position for every predetermined cycle or every set cycle by interruption process is made. A device such as FPGA (Field-Programmable Gate Array) may be used as hardware of a digital circuit to execute similar process.

A combination of a light source such as an LED, a semi-conductor laser or the like, and an electric circuit that controls the light source may be an example of the constitution of the exposure light source 20. The electric circuit for controlling the light source receives the exposure controlling signal from the controlling unit 60 to control irradiation/stoppage of the exposure light. When a light source that is difficult to switch on/off at high speed such as a lamp or the like is used, a shutter or a high speed switching mechanism that uses an optical element or the like may be provided in the exposure light source 20 to control on/off of the exposure light.

Figure 3:
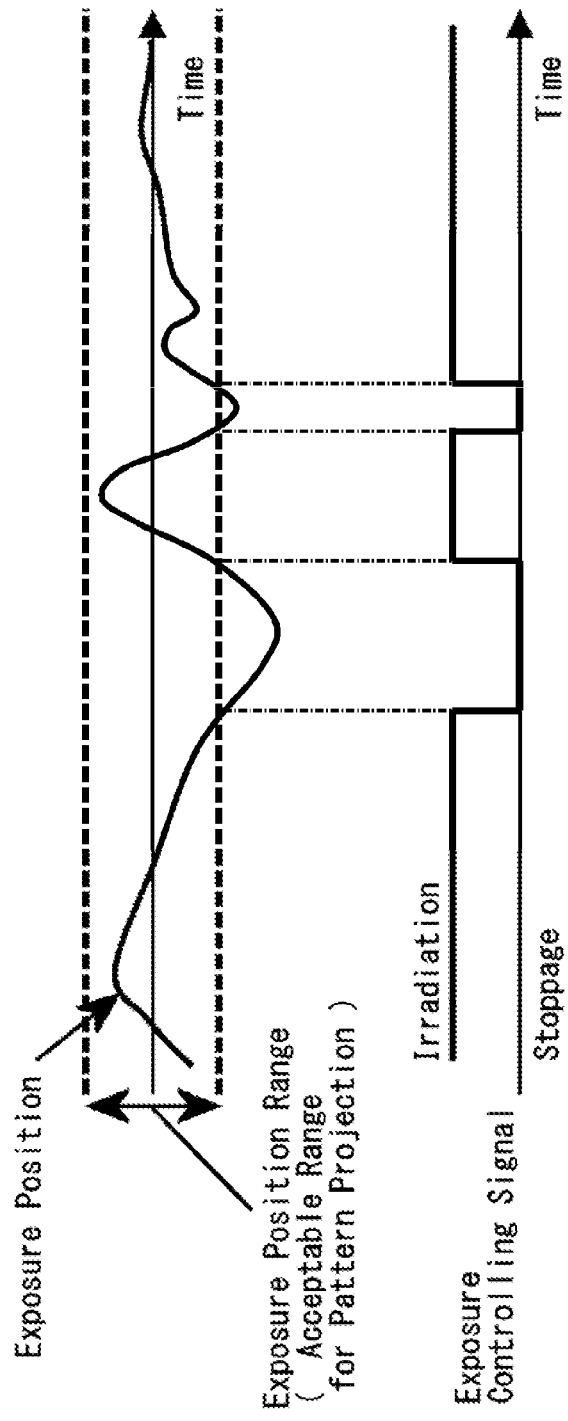
FIG. 3 shows exposure control signals in accordance with change of the exposure position in the aforementioned embodiment.

FIG. 3 shows an example when the exposure controlling signal is associated with change of the exposure position on the work by the exposure control of the present embodiment. Execution of such exposure control by the exposure device 10 of the present embodiment allows the exposure light to be irradiated only within the exposure position range since the exposure light will be stopped if the exposure position is out of the exposure position range. As a result, the exposure position can be in the predetermined range on the work even if the exposure device is affected by positioning including residual vibration after stepping movement. Further, the exposure control of the present embodiment functions effectively not only during residual vibration, but also in a steady state of positioning.

In FIG. 1, mechanism portions such as the mask moving base 30, the work moving base 50 and the like, including the displacement sensors 33, 53, are constituted only in Y-direction to simplify explanation. Similarly, in FIG. 3, the exposure position, the exposure position range, and the exposure controlling signal regarding the one-dimensional position in Y-direction are shown.

However, the degree of freedom of the exposure mask and the work are spatially six degrees of freedom at maximum (micro vibration or the like of the position and the posture) in actual exposure devices. Therefore, the exposure position range of the present embodiment is set at six degrees of freedom at maximum, so that high precision of the exposure position becomes possible. In the exposure device of such case, the displacement sensor is disposed so that the position and the posture of the exposure mask can be detected at six degrees of freedom at maximum. Further, the displacement sensor is disposed so that the position and the posture of the work can be detected at six degrees of freedom at maximum.

For example, information of the position of the exposure mask and information of the position of the work may be treated as a one-dimensional coordinate, a two-dimensional coordinate, or a three-dimensional coordinate data. Information of the exposure position range is set by coordinates in the same dimension as the exposure mask and the work, or a dimension lower than the same.

For example, when a vertically striped pattern of vertical stripes in X-direction is moved by stepping in a horizontal direction (Y-direction) to expose the vertically striped pattern on the work in order, the exposure position range is only set in the horizontal direction. The acceptable range of the exposure position range in the vertical direction of the vertically striped pattern is sufficiently large, so that the exposure control becomes unnecessary and setting of such may be omitted.

On the other hand, in a similar exposure of the vertically striped pattern, position detection in two perpendicular directions may be necessary for detection of the exposure position. For example, when sensors to be disposed in the two perpendicular directions have dispositional angle errors that cannot be ignored, or when the position in the vertical direction affects the position in the horizontal direction due to mechanism of the device, position detection in the vertical direction has to be performed in addition to the horizontal direction, or else errors in the horizontal direction will be generated by the position in the vertical direction of the exposure position.

As for detection of the posture, not only a displacement sensor, but also an inclination detecting sensor may be adopted, as long as inclination of the exposure mask or the work can be detected.

A mechanism that moves at least in one direction, such as the mask moving base 30 or the work moving base 50, is sufficient for the stepping moving operation. However, a moving base that moves in another direction or a tilting base for posture control may be added to perform position control or posture control at a high level.

In general exposure devices, the exposure position on the two-dimensional plane (X-Y plane) and a focal distance of an optical system in a direction perpendicular to the plane (corresponds to the exposure position in Z-direction) need to be kept within a suitable exposure position range. Further, not only the exposure center, but also the entire exposure pattern can be properly exposed on the work by keeping the direction of the exposure pattern face (yaw/pitch/roll) within a suitable exposure direction range. According to the constitution of the exposure device and the constitution of the mechanism portion, there are cases that its position and exposure direction are obviously within the acceptable range. In such case, the degree of freedom used for the exposure controlling signal may be omitted.

In the present embodiment, the exposure position on the work is calculated from each position of the exposure mask 11 and the work 12, and control of irradiation/stoppage of the exposure light source 20 is performed to irradiate the exposure light only when the exposure position is within the designated exposure position range. Thus, the exposure position precision at a level higher than positioning precision of the exposure device 10 can be achieved.

Accordingly, the exposure light can be irradiated within a preset designated range. Further, the exposure range is not determined according to the required exposure time like in Patent Literature 1, and the required exposure time can be freely set without being affected by vibration cycle and vibration amplitude of the work.

Further, the method of the present embodiment can prevent poor exposure by stopping the exposure light even if the exposure position on the work temporarily falls out of the exposure position range due to earthquakes, or other external disturbances.

Second Embodiment

Figure 4:
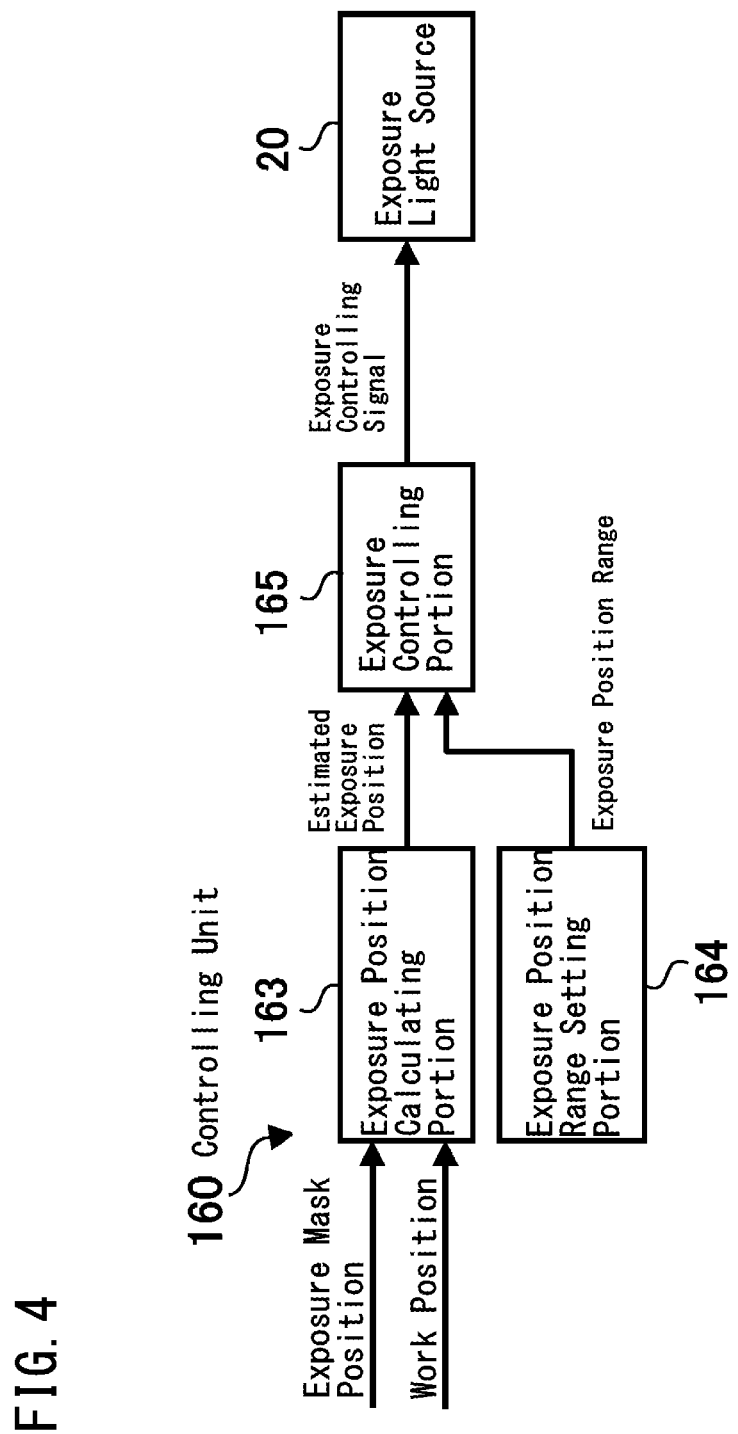
FIG. 4 is a block diagram showing an exposure device according to a second embodiment of the present invention.

FIG. 4 is a block diagram showing the constitution of a controlling unit (controlling circuitry) 160 of the exposure device according to a second embodiment. Constitutions not shown are the same as the exposure device 10 of the first embodiment. The controlling unit 160 is constituted by a digital device capable of performing the exposure position calculation for every sampling time ($\Delta t$). By using this, the exposure position after a certain set time can be estimated by using information of the exposure position to the present time to control irradiation/stoppage of the exposure light based on the estimated exposure position.

Figure 5:
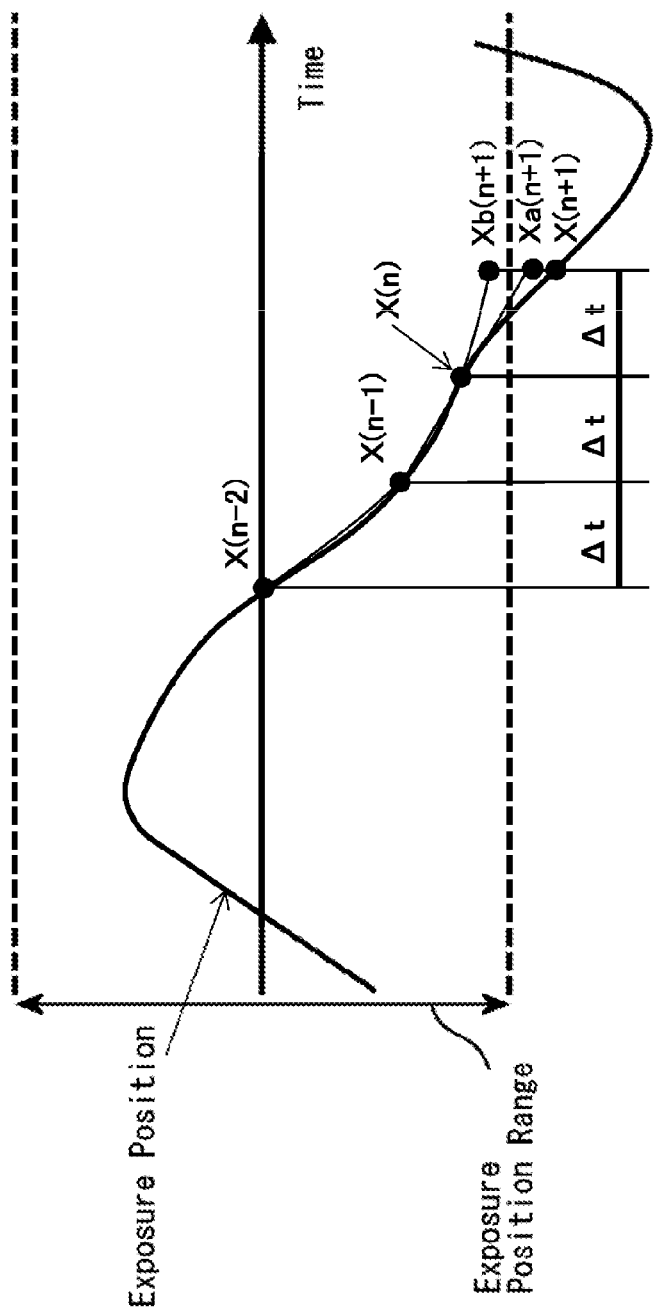
FIG. 5 shows examples of a calculating method of the estimated exposure position in the aforementioned embodiment.

When a case that the exposure position changes as shown in FIG. 5 is considered, the exposure light can be stopped at the exposure position outside the exposure position range (at X(n+1) in FIG. 5) because the exposure controlling portion discretely controls the exposure light. Although the exposure position is already out of the exposure position range, irradiation of the exposure light continues until a next timing for the exposure position calculation (at X(n+1)). This is because it is a discrete system that performs process for every sampling cycle. Usually, the irradiation time of the exposure light outside the exposure position range is shortened by shortening the sampling cycle.

As a method to reduce such errors of the exposure positions without shortening the sampling cycle, the present embodiment adopted a method of which the exposure position calculating portion 163 of FIG. 4 calculates velocity of the position or velocity and acceleration of the position based on the time-series information of the position to the present time, and calculates the estimated exposure position after the sampling time (Δt), so that the exposure controlling portion 165 uses the estimated exposure position to control irradiation/stoppage of the exposure light.

Assuming that the exposure position operates uniform motion during the sampling time (Δt), the estimated exposure position (Xa(n+1) in FIG. 5) can be expressed by using Velocity V(n) of the position as in the following equation (1). As a first example, a method to calculate solution of Xa(n+1) from the time-series information of the exposure position is described.

$$Xa(n+1)=X(n)+V(n)\cdot \Delta t \qquad (1)$$

Velocity at Time n is calculated by a backward difference method.

$$V(n)=(X(n)-X(n-1))/\Delta t \qquad (2)$$

Then, the equation (2) is substituted for the equation (1).

$$Xa(n+1)=X(n)+(X(n)-X(n-1))/\Delta t \cdot \Delta t$$

$$Xa(n+1)=2\cdot X(n)-X(n-1) \qquad (3)$$

Similarly, assuming that the exposure position operates uniform acceleration motion during the sampling time (Δt), the estimated exposure position (Xb(n+1) in FIG. 5) can be expressed by using Velocity V(n) and Acceleration α(n) of the position as in the following equation (4). As a second example, a method to calculate solution of Xb(n+1) from the time-series information of the exposure position is described.

$$Xb(n+1)=X(n)+V(n)\cdot \Delta t + \tfrac{1}{2}\cdot \alpha(n)\cdot \Delta t^2 \qquad (4)$$

Acceleration α(n) at Time n is calculated by a backward difference method.

$$\alpha(n)=(V(n)-V(n-1))/\Delta t \qquad (5)$$

$$V(n-1)=(X(n-1)-X(n-2))/\Delta t \qquad (6)$$

Then, the equations (2) and (6) are substituted for the equation (5).

$$\alpha(n)=((X(n)-X(n-1))/\Delta t -(X(n-1)-X(n-2))/\Delta t)/\Delta t$$

$$\alpha(n)=(X(n)-X(n-1)-(X(n-1)-X(n-2)))/\Delta t^2$$

$$\alpha(n)=(X(n)-2\cdot X(n-1)+X(n-2))/\Delta t^2 \qquad (7)$$

Then, the equations (2) and (7) are substituted for the equation (4).

$$Xb(n+1)=X(n)+(X(n)-X(n-1))/\Delta t \cdot \Delta t + \tfrac{1}{2}\cdot (X(n)-2\cdot X(n-1)+X(n-2))/\Delta t^2 \cdot \Delta t^2$$

$$Xb(n+1)=2\cdot X(n)-X(n-1)+\tfrac{1}{2}\cdot (X(n)-2\cdot X(n-1)+X(n-2))$$

$$Xb(n+1)=2.5\cdot X(n)-2\cdot X(n-1)+\tfrac{1}{2}\cdot X(n-2) \qquad (8)$$

In two examples mentioned above, the estimated exposure positions are calculated by Taylor expansion from the time-series information of the positions to the present time. That is, velocity is used for the first-degree equation, and velocity and acceleration are used for the second-degree equation. Similarly, the estimated exposure position can also be calculated by a higher order Taylor expansion and higher-order differentials.

Further, although the backward difference method is used to calculate the differential value in the aforementioned examples, various methods used in digital filters such as bilinear transform or the like may be used to calculate the any order differential.

The exposure control of the present embodiment can calculate the estimated exposure position after the set time, for example after the sampling time (Δt), in advance based on the time-series information of the exposure position to the present time by calculating the exposure position from the position of the exposure mask 11 or the position of the work 12.

After calculating the estimated positions of the exposure mask and the work after the sampling time (Δt) from each time-series information of the positions of the exposure mask and the work by applying the above, the estimated exposure position can be calculated based on the estimated positions in advance, so that the irradiation time to the outside of the exposure position range can be shortened.

However, only problems of the discrete system that performs calculation for every sampling time (Δt) in the exposure position calculation are considered in the aforementioned examples. Processing time (Td) required from an input timing of the position of the exposure mask 11 or the work 12 to completion of stopping the exposure light by the exposure light source 20 is not considered.

Figure 6:
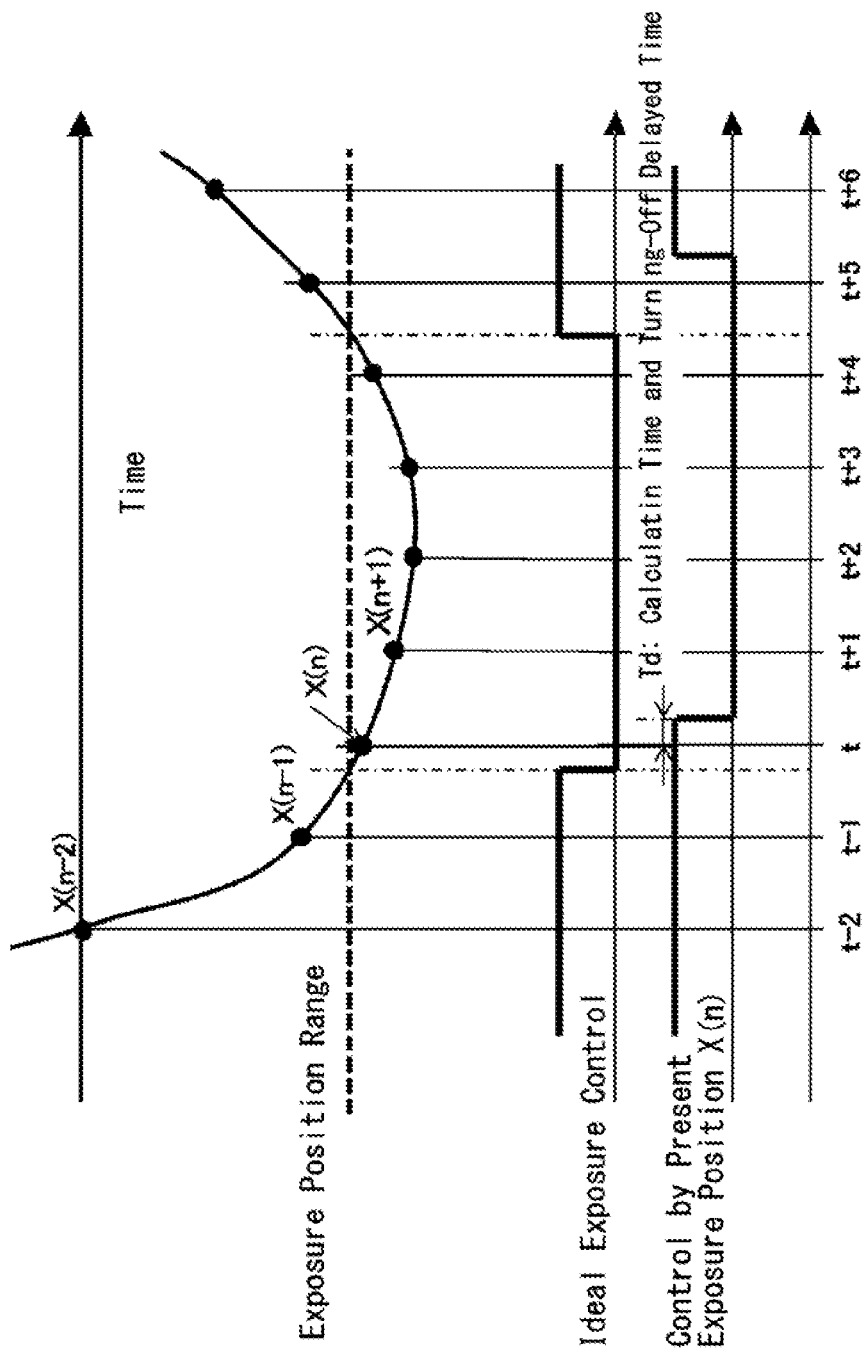
FIG. 6 shows exposure controlling signals for explaining why an irradiation time of irradiation to the outside of the exposure position range is elongated by a calculating time and a turning on/off delayed time in control performed by a present position.

This processing time (Td) is described with reference to FIG. 6. The exposure position on the work is assumed to change in a locus as shown in a curve of FIG. 6, for example. Therefore, ideally, the exposure controlling signal should be switched from irradiation to stop at a timing that the curve of the exposure position and the lower limit of the exposure position range intersect. This ideal switching timing is shown by a dot and dash line between Times t−1 and t.

In actual exposure control, the exposure positions expressed by X(n−2), X(n−1), X(n), X(n+1) at every sampling time (Δt) are calculated. According to the exposure control based on the present exposure position in the first embodiment (the controlling unit 60 of FIG. 1), the controlling unit 60 reads out the detected values from each displacement sensors 33, 53 at Time t, for example, to calculate the exposure position X(n). Then, the controlling unit 60 compares the exposure position X(n) and the exposure position range, and emits the exposure controlling signal for irradiation or stoppage to the exposure light source 20. However, in such exposure control based on the present exposure position, process of stopping the exposure is further delayed for a total time of the time from read-out of the detected value to output of the exposure controlling signal by the control unit 60 (calculation time) and the time that the exposure light source 20 receives the exposure controlling signal of stopping the exposure until completion of the same (turning-off delayed time). This total time is referred to as the processing time (Td) herein.

Figure 7:
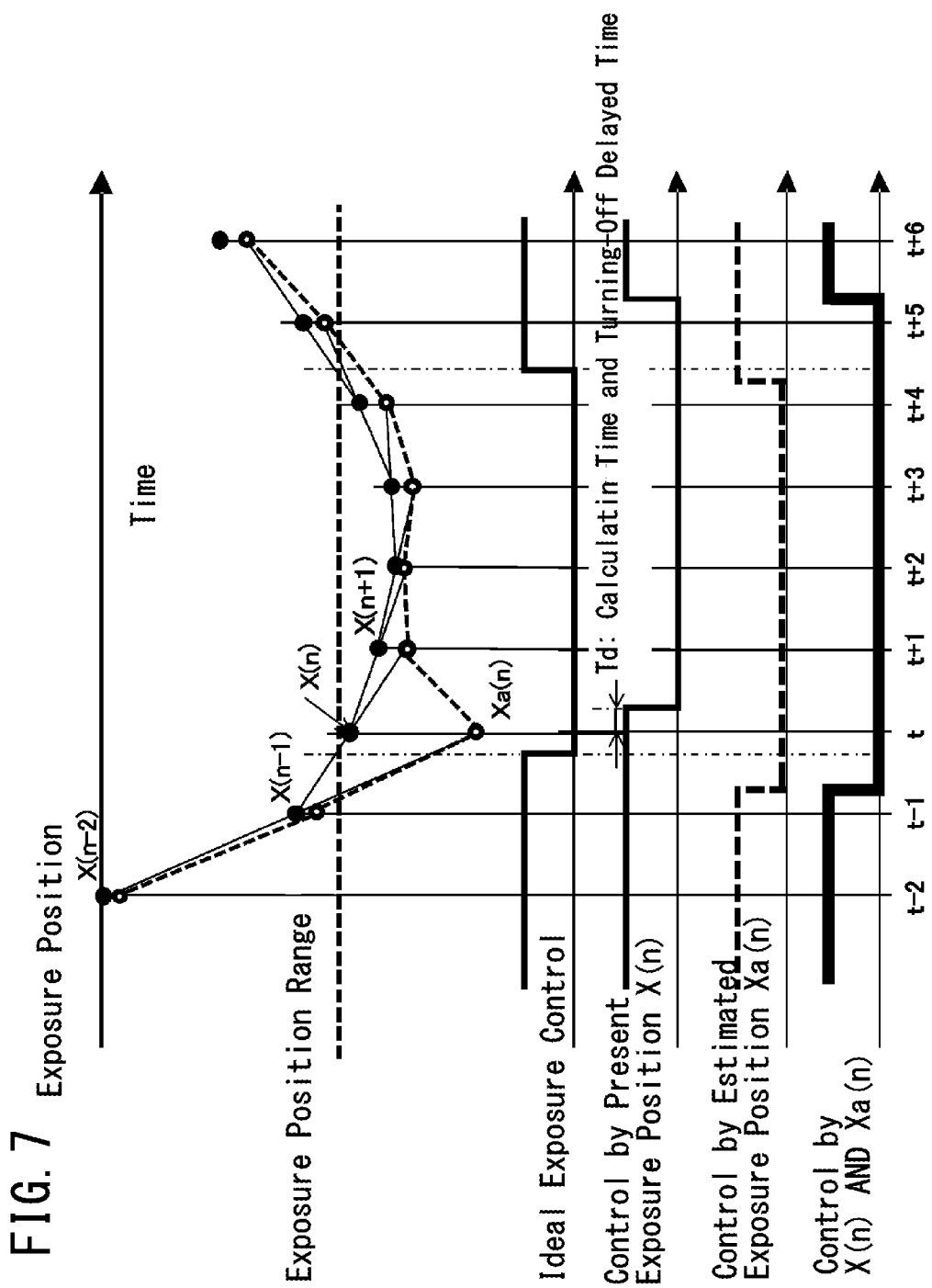
FIG. 7 is a diagram for explaining the exposure controlling method that uses an estimated position in the aforementioned embodiment.

Next, the exposure control by the estimated exposure position Xa(n) of the present embodiment is described with reference to FIG. 7. In addition to the exposure position Xn) of FIG. 6, FIG. 7 shows the estimated exposure positions Xa(n) calculated by the equation (3) of uniform motion in white circles, and lines that connect these estimated positions in a broken line. For example, in a process at Time t−1, the exposure position X(n−1) based on the detected value is calculated, and, at the same time, the estimated exposure position Xa(n) after the set time (sampling time Δt) is calculated by substituting information of the exposure positions (X(n−2), X(n−1)) to the present time for the equation (3). As a result, in the process at Time t−1, the exposure position based on the estimated exposure position Xa(n) at a next Time t is determined. In this case, as the estimated exposure position Xa(n) is outside the exposure position range, a stoppage of exposure can be completed at a timing of which the processing time (Td) has passed from Time t−1. Such exposure controlling signals by the estimated exposure positions Xa(n) are shown in the broken line in FIG. 7.

As a modified example of the present embodiment, a method to improve exposure position precision is described with reference to FIG. 8. Similar to FIG. 7, the estimated exposure position is calculated by uniform motion in FIG. 8, but its set time is different. That is, the sampling time (Δt) is set as the set time in FIG. 7, but a time (Δt+Td) of which the processing time (Td) is added to the sampling time (Δt) is preset as the set time in FIG. 8.

Figure 8:
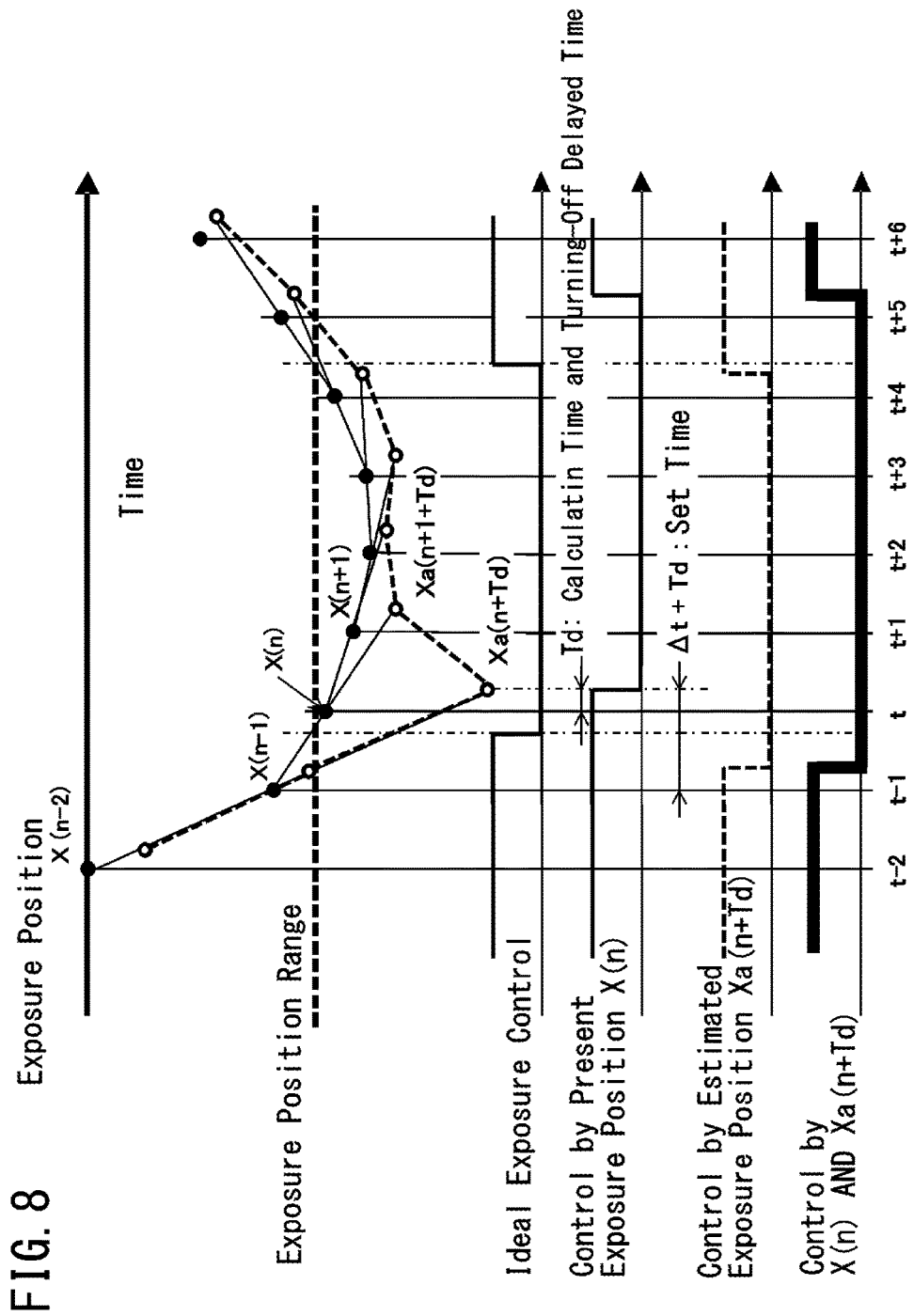
FIG. 8 is a diagram for explaining the exposure controlling method that further takes the calculating time and turning on/off delayed time into consideration as a modified example of the aforementioned embodiment.

In this case, the estimated exposure position (Xa(n+1+Td) in FIG. 8) can be expressed by using Velocity V(n) of the position like the following equation (9).

$$Xa(n+1+Td)=X(n)+V(n)\cdot(\Delta t+Td) \quad (9)$$

Here, Td=k·Δt (0<k), $$Xa(n+1+Td)=X(n)+V(n)\cdot(\Delta t+k\cdot\Delta t) \quad (10)$$

Then, the equation (10) is substituted for the equation (2).

$$Xa(n+1+Td)=X(n)+(X(n)-X(n-1))/\Delta t\cdot(\Delta t+k\cdot\Delta t)$$

$$Xa(n+1+Td)=X(n)+(X(n)-X(n-1))/\Delta t\cdot\Delta t\cdot(1+k)$$

$$Xa(n+1+Td)=X(n)+(X(n)-X(n-1))\cdot(1+k)$$

$$Xa(n+1+Td)=X(n)+X(n)\cdot(1+k)-X(n-1)\cdot(1+k)$$

$$Xa(n+1+Td)=X(n)\cdot(2+k)-X(n-1)\cdot(1+k) \quad (11)$$

In such way, the estimated exposure position Xa(n+1+Td) after the set time (Δt+Td) is calculated based on the equation (11). Accordingly, irradiation/stoppage of the exposure light can be controlled by using the estimated exposure position at the time when the exposure light source 10 actually stops irradiation of the exposure light, and thus more precise exposure control becomes possible.

The method of FIG. 8 is especially effective when a light source that takes relatively long processing time (Td) to stop the exposure light is used. This method is especially effective in case that the processing time (Td) is longer than the sampling time (Δt).

An example of the exposure control by X(n) AND Xa(n) is shown in FIG. 7, and an example of the exposure control by X(n) AND Xa(n+Td) is shown in FIG. 8. In this controlling method, a controlling signal that combines the exposure controlling signal by the present position X(n) and the exposure controlling signal by the estimated exposure position Xa(n) or Xa(n+Td) by AND condition is used. In this controlling signal by AND condition, the signal will be "irradiation" when both of the two exposure controlling signals (X(n) and Xa(n) or Xa(n+Td) are "irradiation", and the signal will be "stop" when at least either one is "stop".

In the exposure control by the estimated exposure position Xa(n) or Xa(n+Td), there are cases that exposure restarts at a timing earlier than the exposure control by the present time X(n) when the exposure light is switched from the stoppage to irradiation, and a period that the exposure light is irradiated to the outside the exposure position range may be generated. Hence, the controlling signal by AND condition is used, so that the exposure controlling signal can be switched to "stop" at an earlier timing by using the estimated position to stop exposure, and the exposure controlling signal can be switched to "irradiation" when the exposure position enters the exposure position range to restart exposure afterwards. As a result, irradiation to the outside of the exposure position range can be prevented in the present example.

As a method for calculating the estimated exposure position from the time-series information of the position to the present time, a general extrapolation method may be adopted. For example, from a plurality of the time-series information of the position to the present time, a straight line or a parabola corresponding thereto is calculated by a least-squares method or the like, and the estimated exposure position at a time after the set time can be calculated.

In cases where the digital device that performs the exposure position calculation for every sampling time like the present embodiment, irradiation of the exposure light to the outside of the designated range can be prevented by calculating the estimated exposure position from the time-series information of the position or each time-series information of the position and the posture.

When a digital device that performs the exposure position calculation for every sampling time is used, velocity of the position (and the posture) or velocity and acceleration of the same is/are calculated from the time-series information of the position (and the posture) to calculate the estimated exposure position at the next obtaining cycle, so that irradiation of the exposure light to the outside of the designated range due to the change of the exposure position during a period until the next obtaining cycle can be reduced.

Third Embodiment

Figure 9:
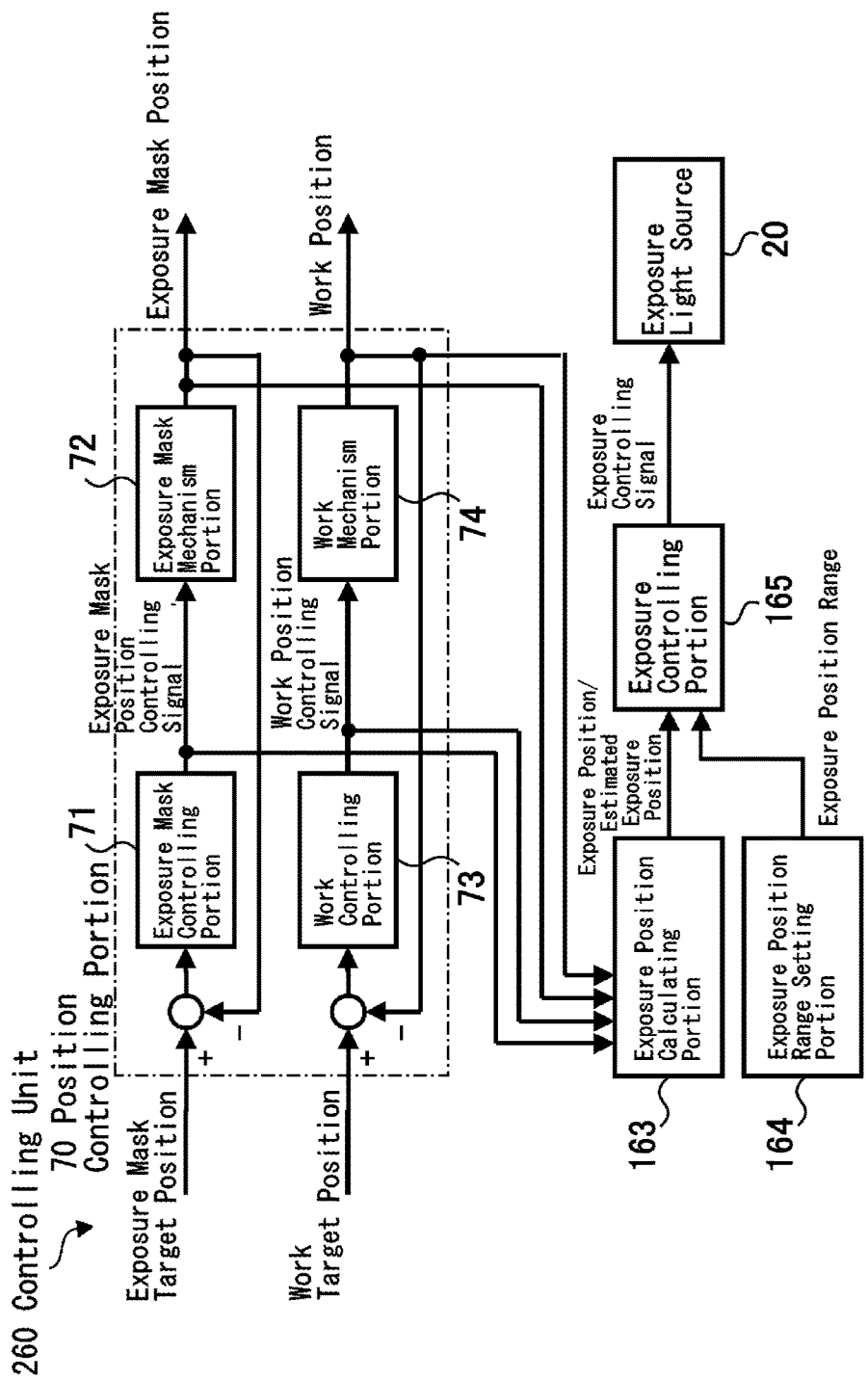
FIG. 9 is a block diagram showing an exposure device according to a third embodiment of the present invention.

FIG. 9 is a block diagram of the exposure device according to a third embodiment. Matters in common with the exposure device and the exposure control of the second embodiment are omitted.

As shown in FIG. 9, a controlling unit (controlling circuitry) 260 of the present embodiment includes a constitution of a position controlling portion 70 for each position control of the exposure mask and the work. In these position controls, each position of the exposure mask and the work are controlled for every predetermined sampling time (Δt). While the controlling unit 260 calculates the exposure position, at least each position control of the exposure mask and the work is executed. That is, the exposure mask controlling portion 71 in the position controlling portion 70 outputs a position controlling signal that makes the difference between the target position and the position detection value of the exposure mask small to an exposure mask mechanism portion 72 to drive-control the same. Similarly, a work controlling portion 73 in the position controlling portion 70 outputs a position controlling signal that makes the difference between the target position and the position detection value of the work small to a work mechanism portion 74 to drive-control the same.

As an exposure position calculating portion 163, an observer (state observing device) capable of calculating each exposure position of the exposure mask and the work is provided. By using the observer, the exposure position and the estimated exposure position can be calculated from each position controlling signal of the exposure mask and the work and the time-series information of each position of the exposure mask and the work. Moreover, as information of the exposure position and the estimated exposure position that are calculated are in state quantity that can be obtained by the observer, they are superior in stability of the calculated value and it exhibits a faster convergence of the calculated error.

Although it is not shown in FIG. 9, the controlling unit 260 may comprise both of a constitution for each position control of the exposure mask and the work and a constitution for each posture control of the exposure mask and the work. Further, as the exposure position calculating portion 163, an observer (state observing device) capable of calculating both of the exposure position and the exposure direction may be provided.

By using the observer, the exposure position and the exposure direction can be calculated from each position controlling signal of the exposure mask and the work, each posture controlling signal of the exposure mask and the work, and the time-series information of each position and each posture of the exposure mask and the work. Moreover, as each information of the exposure position and the exposure direction that are calculated are in state quantity that can be obtained by the observer, they are superior in stability of the calculated value of the exposure position and the exposure direction and it exhibits a faster convergence of the calculated error.

Fourth Embodiment

Figure 10:
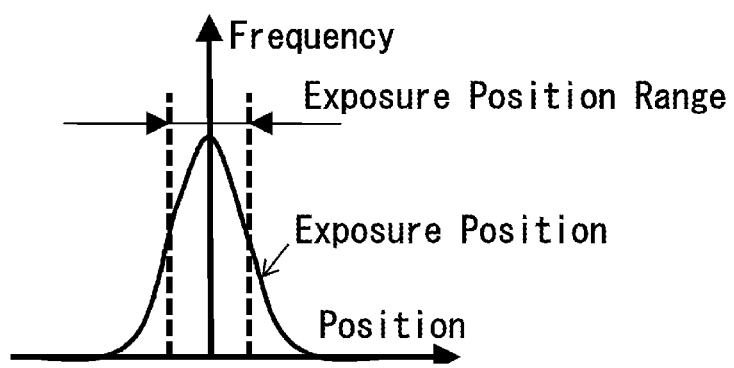
FIG. 10 is a diagram of a histogram showing distribution of exposure positions on the work.

When positioning control is performed by controlling each position of the exposure mask and the work, the exposure position in PI controlling system that is properly adjusted is considered to be in a normal distribution as shown in distribution of the exposure position in FIG. 10. For example, when the exposure position range is set as a standard deviation ±σ of the exposure position distribution in FIG. 10, the exposure controlling signal becomes a command signal (irradiation signal) that executes irradiation of the exposure light at frequency of about 68.3%.

When the exposure position distribution is considered to be in the normal distribution like FIG. 10, ratio of the irradiation time of the exposure controlling signal can be estimated by setting the exposure position range. Further, even if it is not in the normal distribution, ratio of the irradiation time can be calculated from the exposure position distribution that is actually measured when reproducibility of the exposure position distribution is high.

FIG. 11 is a diagram that shows controlling state in time-series when the exposure control according to the fourth embodiment is executed. Matters in common with the exposure devices and the exposure control of the foregoing embodiments are omitted.

In the present embodiment, an exposure enable signal is used to set an upper limit of an exposure completion waiting time. Further, abnormality of exposure can be observed by setting an exposure time required for exposure (also referred to as an irradiation time) and a value which is the exposure required time multiplied by a predetermined safety factor based on a ratio of the exposure time. Further, the upper limit of the exposure completion waiting time may be set to a value which is the exposure required time measured under the same condition multiplied by a predetermined safety factor.

FIG. 11 shows examples of the exposure position, the exposure controlling signal, an integrated exposure time, and a set integrated exposure time when the upper limit of the exposure completion waiting time is set to the exposure enable signal. In this example, exposure is completed within the upper limit of exposure completion waiting time. If exposure does not complete within the upper limit of the exposure completion waiting time, it is determined as an exposure abnormality, and error is generated. Accordingly, abnormality of exposure can be observed.

DESCRIPTION OF REFERENCE NUMBERS

10 Exposure device
11 Exposure mask
12 Work
20 Exposure light source
30 Mask moving base
40 Projecting lens
50 Work moving base
60, 160, 260 Controlling unit
63, 163 Exposure position calculating portion
64, 164 Exposure position range setting portion
65, 165 Exposure controlling portion
70 Position controlling portion

The invention claimed is:

1. An exposure method for projecting a pattern of an exposure mask onto a work by an exposure light, the exposure method comprising:
   moving the exposure mask to a target exposure position on the work;
   position-controlling a position of the exposure mask at the target exposure position;
   calculating an exposure position on the work from a relative positional relationship of the exposure mask and the work;
   setting a predetermined range that includes the target exposure position on the work and permits projecting the pattern even when the exposure position is out of the target exposure position as an exposure position range; and
   executing an exposure control by an exposure controlling signal that executes irradiation of the exposure light to the exposure mask when the calculated exposure position is in the set exposure position range, and that stops irradiation of the exposure light when the exposure position is out of the exposure position range, while the position of the exposure mask is position-controlled at the target exposure position,
   wherein the exposure light is irradiated for a predetermined exposure time by the exposure control.

2. The exposure method according to claim 1,
   wherein position information of the exposure mask and the work are expressed by a one-dimensional coordinate, a two-dimensional coordinate, or a three-dimensional coordinate, and
   wherein information of the exposure position range is set by a coordinate in a dimension same as or lower than the exposure mask and the work.

3. The exposure method according to claim 1,
   wherein, in the calculating, the exposure position is calculated for every predetermined calculating cycle (∆t), and an estimated exposure position after a set time based on a time-series information of the exposure position to a present time is calculated, and
   wherein, in the executing, the exposure control is executed based on at least one of the exposure position or the estimated exposure position.

4. The exposure method according to claim 3,
   in the calculating, velocity based on the time-series information of the exposure position to the present time is used, or both of velocity and acceleration are used to calculate the estimated exposure position after the set time.

5. The exposure method according to claim 3, further comprising position-controlling each position of the exposure mask and the work for every predetermined sampling time,
wherein at least the position-controlling is executed during execution of the calculating, and
wherein, in the calculating, the exposure position and the estimated exposure position are calculated by a state observing device which receives each position controlling signal of the exposure mask and the work used in the position-controlling and the time-series information of the positions of the exposure mask and the work as input values.

6. The exposure method according to claim 3, wherein time necessary from detection of the positions of the exposure mask and the work to a stoppage of the exposure light is regarded as a processing time (Td), and
in the calculating, a time in which the processing time (Td) is added to the calculating cycle (Δt) is set as the set time, and the estimated exposure position after the set time is calculated.

7. The exposure method according to claim 1,
wherein, in the calculating, the exposure position is calculated for every predetermined calculating cycle (Δt) and after estimated positions of the exposure mask and the work after a set time are respectively calculated based on time-series information of each position of the exposure mask and the work to a present time, an estimated exposure position, after the set time, is calculated, and
wherein, in the executing the exposure control is executed based on at least one of the exposure position or the estimated exposure position.

8. The exposure method according to claim 7,
in the calculating, velocities of the exposure mask and the work based on the time-series information of each position of the exposure mask and the work to the present time are used, or both of velocities and accelerations of the exposure mask and the work are used to calculate each estimated position of the exposure mask and the work after the set time.

9. The exposure method according to claim 7, further comprising position-controlling each position of the exposure mask and the work for every predetermined sampling time,
wherein at least the position-controlling is executed during execution of the calculating, and
wherein, in the calculating, the exposure position and the estimated exposure position are calculated by a state observing device which receives each position controlling signal of the exposure mask and the work used in the position-controlling and the time-series information of the positions of the exposure mask and the work as input values.

10. The exposure method according to claim 7, wherein time necessary from detection of the positions of the exposure mask and the work to a stoppage of the exposure light is regarded as a processing time (Td), and
in the calculating, a time in which the processing time (Td) is added to the calculating cycle (Δt) is set as the set time, and the estimated exposure position, after the set time, is calculated.

11. The exposure method according to claim 1,
wherein the calculating further comprises calculating an exposure direction on the work from a relative relationship of the postures of the exposure mask and the work,
wherein the setting further comprises setting of a predetermined range that includes a target exposure direction on the work and permits projecting the pattern even when the exposure direction is out of the target exposure direction as an exposure direction range, and
wherein, in the executing, irradiation of the exposure light is executed when the exposure position is in the exposure position range and the exposure direction is in the exposure direction range.

12. The exposure method according to claim 11, wherein time necessary from detection of the positions of the exposure mask and the work to a stoppage of the exposure light is regarded as a processing time (Td), and
in the calculating, the exposure position is calculated for every predetermined calculating cycle (Δt), a time in which the processing time (Td) is added to the calculating cycle (Δt) is set as a set time, and an estimated exposure position is calculated or an estimated exposure position and an estimated exposure direction after the set time are calculated.

13. The exposure method according to claim 1, further comprising
integrating an irradiation time of the exposure light based on the exposure controlling signal to calculate an integrated exposure time, and
determining an exposure abnormality when a time after integrating start exceeds an upper limit of an exposure completion waiting time before the integrated exposure time reaches the predetermined exposure time.

14. An exposure device comprising:
an exposure light source;
an exposure mask disposed at a position where an exposure light from the exposure light source is received;
a projecting lens that projects a pattern of the exposure mask onto a work;
a detector that detects a relative positional relationship of the exposure mask and the work;
a moving base that relatively moves the exposure mask and the work to change an exposure position on the work; and
controlling circuitry configured to control at least irradiation/stoppage of the exposure light source,
wherein the controlling circuitry is further configured to:
move the exposure mask to a target exposure position on the work,
position-control a position of the exposure mask at the target exposure position,
calculate an exposure position on the work from the relative positional relationship of the exposure mask and the work,
set a predetermined range as an exposure position range that includes the target exposure position on the work and permits projecting the pattern even when the exposure position is out of the target exposure position, and
execute an exposure control by an exposure controlling signal that executes irradiation of the exposure light to the exposure mask when the calculated exposure position is in the set exposure position range, and that stops irradiation of the exposure light when the exposure target position is out of the exposure position range, while the position of the exposure mask is position-controlled at the target exposure position, and wherein the exposure light is irradiated for a predetermined exposure time by the exposure control.

15. The exposure device according to claim 14,
wherein the controlling circuitry is further configured to position-control each position of the exposure mask and the work for every predetermined sampling time, wherein at least the position-controlling is executed while the calculating is executed, and wherein the controlling circuitry is further configured to receive each position controlling signal of the exposure mask and the work used in the position-controlling and a time-series information of the positions of the exposure mask and the work as input values and to calculate the exposure position and an estimated exposure position.

* * * * *

UNITED STATES PATENT AND TRADEMARK OFFICE
CERTIFICATE OF CORRECTION

PATENT NO. : 10,459,344 B2
APPLICATION NO. : 16/138006
DATED : October 29, 2019
INVENTOR(S) : Motonori Ogihara Page 1 of 1

It is certified that error appears in the above-identified patent and that said Letters Patent is hereby corrected as shown below:

In the Claims

Column 16, Line 56 in Claim 3, "(At)" should read --($\Delta$t)--.

Signed and Sealed this
Seventh Day of July, 2020

Andrei Iancu
*Director of the United States Patent and Trademark Office*